(12) United States Patent
Harkness (10) Patent No.: US 8,115,475 B2
(45) Date of Patent: Feb. 14, 2012

(54) MANIPULATION ASSEMBLY FOR ONLINE ELECTRICAL SYSTEM TEST PROBE INSTALLATION

(75) Inventor: Ashley Harkness, Dublin, CA (US)

(73) Assignee: Electrical Reliability Services, Inc., San Ramon, CA (US)

( * ) Notice: Subject to any disclaimer, the term of this patent is extended or adjusted under 35 U.S.C. 154(b) by 253 days.

(21) Appl. No.: 12/565,457

(22) Filed: Sep. 23, 2009

(65) Prior Publication Data

US 2011/0068773 A1   Mar. 24, 2011

(51) Int. Cl.
*G01R 15/18* (2006.01)
(52) U.S. Cl. .................. 324/127; 324/126; 324/76.11
(58) Field of Classification Search .................. None
See application file for complete search history.

(56) References Cited

U.S. PATENT DOCUMENTS

| | | | |
|---|---|---|---|
| 1,125,057 A | 1/1915 | Bull | |
| 2,195,045 A | 3/1940 | Bernay | |
| 2,759,262 A | 8/1956 | Belsky | |
| 4,048,605 A | 9/1977 | McCollum | |
| 4,283,677 A | 8/1981 | Niwa | |
| D260,635 S | 9/1981 | Lockwood | |
| 4,316,142 A * | 2/1982 | Kuramoto | 324/127 |
| 4,847,780 A | 7/1989 | Gilker et al. | |
| 5,075,629 A | 12/1991 | Umemura et al. | |
| 5,613,301 A | 3/1997 | Sheu | |
| 5,656,931 A | 8/1997 | Lau et al. | |
| 5,726,576 A | 3/1998 | Miyata et al. | |

(Continued)

FOREIGN PATENT DOCUMENTS

CN   2426638   4/2001

(Continued)

OTHER PUBLICATIONS

Fischer Custom Communications. "FCC Monitor Current Probes", http://www.fischercc.com/secondary_pages/instrumentation/monito..., visited Apr. 27, 2009, (3 pages).

(Continued)

*Primary Examiner* — Jermele M Hollington
*Assistant Examiner* — Trung Nguyen
(74) *Attorney, Agent, or Firm* — Kinney & Lange, P.A.

(57) ABSTRACT

An apparatus for online partial discharge testing includes a split-core radio-frequency current transformer sensor, an actuation subassembly, and a biasing member. The current transformer sensor has a first portion, a second portion, and a sensor hinge operably engaged between the first portion and the second portion. The actuation subassembly includes an elongate first member secured to the first portion of the current transformer sensor, a second member secured to the second portion of the current transformer sensor and configured to be movable relative to the first member, and a third member engaged with the second member and configured to be movable relative to the first member. The biasing member is configured to pivotally bias the first portion and the second portion of the current transformer sensor toward each other relative to the sensor hinge, with the biasing member secured relative to the first member.

17 Claims, 6 Drawing Sheets

U.S. PATENT DOCUMENTS

| | | | |
|---|---|---|---|
| 6,385,852 B1 | 5/2002 | Huang | |
| 6,586,923 B2 | 7/2003 | Seike | |
| 6,930,491 B2 | 8/2005 | Gregory et al. | |
| 7,081,757 B2 | 7/2006 | Unsworth et al. | |
| 7,165,014 B2 | 1/2007 | Kaneda et al. | |
| 7,183,776 B1 | 2/2007 | Hicks et al. | |
| 7,202,672 B2 | 4/2007 | Hicks et al. | |
| 7,337,080 B2 * | 2/2008 | Doig et al. | 702/60 |
| 7,412,338 B2 | 8/2008 | Wynans et al. | |
| 2003/0222747 A1 | 12/2003 | Perkinson et al. | |
| 2009/0025828 A1 | 1/2009 | Chen | |
| 2011/0068773 A1 * | 3/2011 | Harkness et al. | 324/127 |

FOREIGN PATENT DOCUMENTS

| | | |
|---|---|---|
| CN | 2775813 Y | 4/2006 |
| JP | 61012007 | 1/1986 |
| JP | 2001297929 A | 10/2001 |
| JP | 2003338416 A | 11/2003 |
| WO | W09724742 | 10/1997 |
| WO | WO2006122415 | 11/2006 |

OTHER PUBLICATIONS

Fu, M. et al., Practical Application of On-Line Partial Discharge Monitoring Techniques on 500kV Shunt Reactors, XIIth International Symposium on High Voltage Engineering, Netherlands 2003, pp. 1-4, Smit (ed.) ISBN 90-77017-79-8.

Russwurm, D., "On-Site Partial Discharge Monitoring Using the Differential LEMKE PROBE LDP-5 and its Accessories", HV Testing, Monitoring, and Diagnostics Workshop, Sep. 13 & 14, 2000, pp. 8-1 to 8-11.

Hubbell Power Systems. "Insulated Hand Tools", Mar. 2009, pp. 2101-2130.

W. H. Salisbury, "CD Catalog—Hotsticks", USA 2006, (20 pages).

W. H. Salisbury "CD Catalog—Blankets", USA 2006, (21 pages).

* cited by examiner

MANIPULATION ASSEMBLY FOR ONLINE ELECTRICAL SYSTEM TEST PROBE INSTALLATION

BACKGROUND

The present invention relates to assemblies and methods for online partial discharge testing, and more particularly to assemblies and methods of installing such assemblies for conducting online partial discharge testing.

Partial discharge sensing can be used to assess the condition of power cables. More particularly, partial discharge sensing can be used to detect deterioration of insulation of power cables by detecting high frequency currents that are created by small gaps, voids, cracks or other degradation in power cable insulation. Online partial discharge sensing refers to time domain and frequency domain testing conducted on objects that remain electrically energized during testing.

Typically, a partial discharge sensing system includes a partial discharge sensor, a signal analyzer, and a signal cable for carrying electrical signals between the sensor and the signal analyzer. In order to conduct a partial discharge test, an operator positions the sensor at a test location on a power cable. Known online partial discharge testing systems utilize split-core sensors, which require the operator to clamp the split core sensor around the energized power cable. Next, the operator manually conducts a partial discharge test using the signal analyzer.

In order to conduct testing on power cables using a known split-core sensor, the operator must be in close proximity to the energized power cables and other charge-carrying components, which may be located within an enclosure that limits operator access and maneuverability. This presents a safety hazard to operators, who risk electrical shock, electrocution, arc blast, and other serious injury from such electrically energized equipment. Operators typically wear protective coverings, such as protective gloves, etc. However, even with protective coverings, it is desired to keep operators as far away from energized equipment as possible to promote operator safety. Yet connecting online partial discharge testing equipment for a distance presents numerous difficulties, including ease of use for operators wearing protective coverings (e.g., thick protective gloves that restrict manual dexterity).

Thus, an alternative online partial discharge testing assembly is desired.

SUMMARY

An apparatus according to the present invention for online partial discharge testing includes a split-core radio-frequency current transformer sensor, an actuation subassembly, and a biasing member. The current transformer sensor has a first portion, a second portion, and a sensor hinge operably engaged between the first portion and the second portion. The actuation subassembly includes an elongate first member secured to the first portion of the current transformer sensor, a second member secured to the second portion of the current transformer sensor and configured to be movable relative to the first member, and a third member engaged with the second member and configured to be movable relative to the first member. The biasing member is configured to pivotally bias the first portion and the second portion of the current transformer sensor toward each other relative to the sensor hinge, with the biasing member secured relative to the first member.

DETAILED DESCRIPTION

In general, the present invention relates to an online partial discharge testing assembly for testing high and medium-voltage power cables, which can facilitate detecting deterioration of insulation of the power cables. The assembly includes an actuation subassembly that allows an operator wearing protective coverings to open and close a split-core current transformer (CT) sensor from a distance. The actuation subassembly can be manipulated using a gripping device. Further details of the present invention will be appreciated in view of the disclosure that follows.

Figure 1:
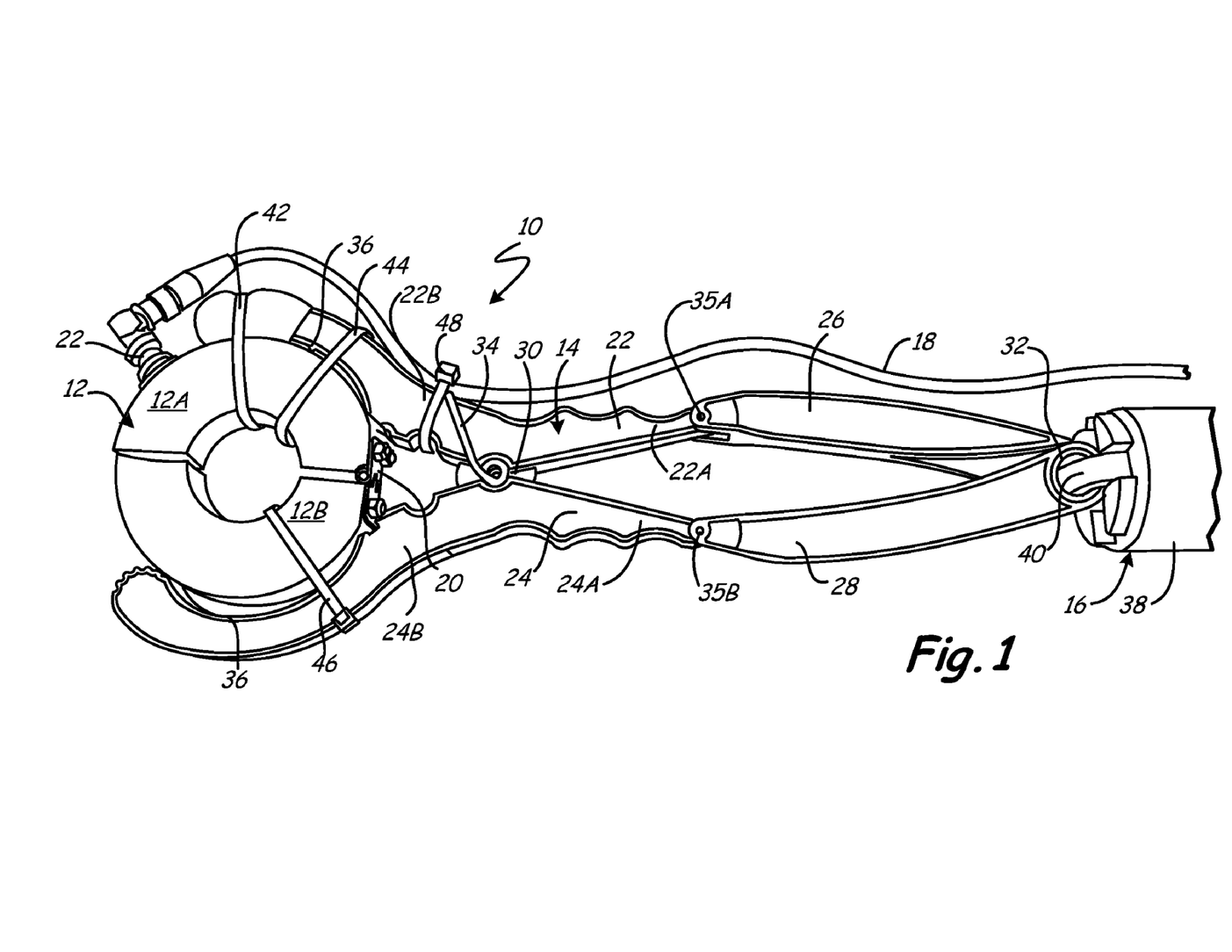
FIG. 1 is a perspective view of one embodiment of an online partial discharge testing assembly according to the present invention, shown in a closed position.
Figure 2:
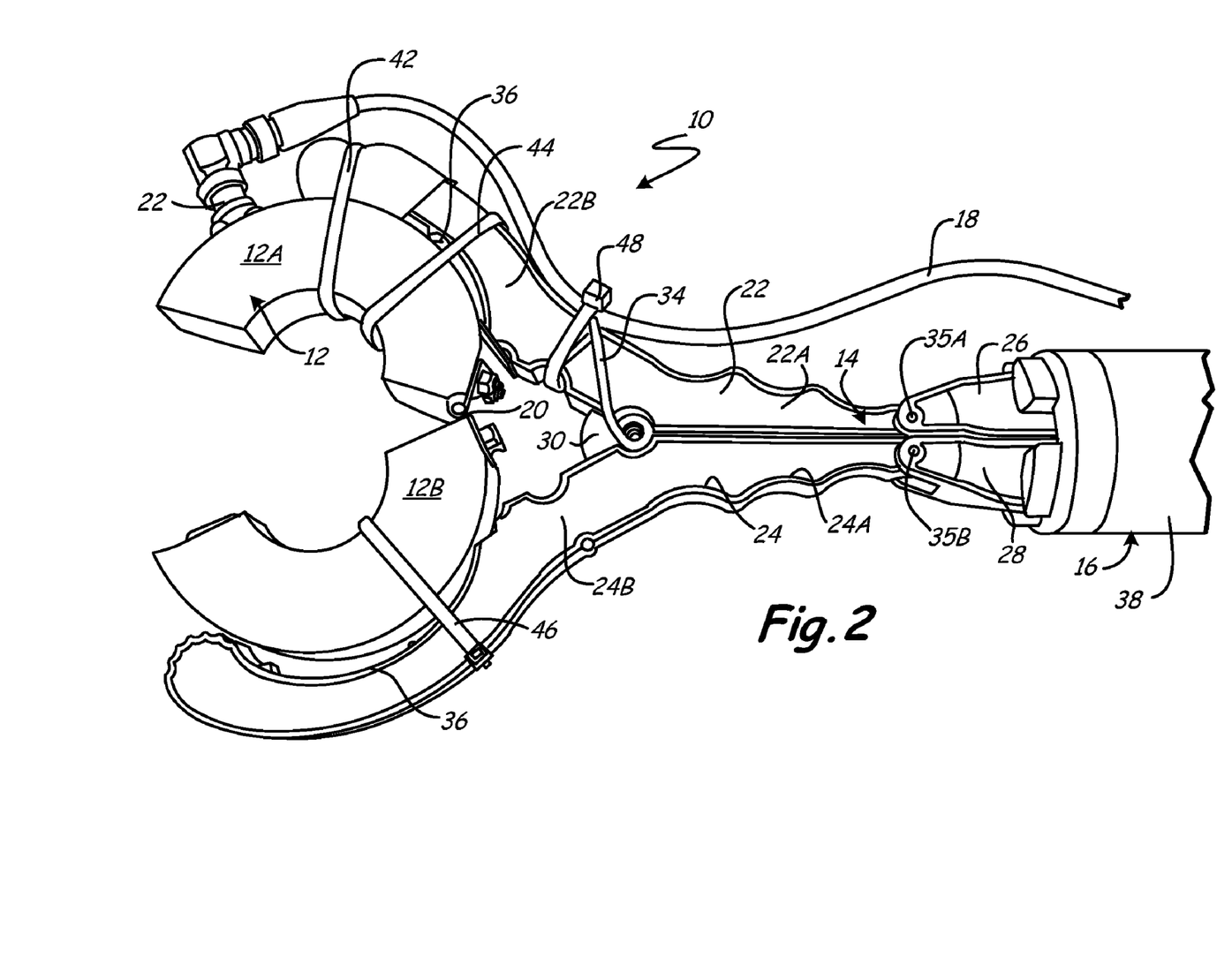
FIG. 2 is a perspective view of the embodiment of the assembly of FIG. 1, shown in an open position.

FIG. 1 is a perspective view of one embodiment of an online partial discharge testing assembly 10, shown in a closed position, and FIG. 2 is a perspective view of the assembly 10 shown in an open position. The assembly 10 includes a CT sensor 12 (i.e., CT test probe), an actuation subassembly 14, a gripping device 16, and a signal cable 18.

The CT sensor 12 can be a split-core radio frequency (RF) sensor of a known configuration. The sensor 12 in the illustrated embodiment includes a first half 12A and a second half 12B that are pivotally connected together by a hinge 20. A central opening defined between the first half 12A and the second half 12B can accept a power cable or other object for testing. The sensor 12 further includes a connector port 22 for electrically connecting the signal cable 18, which can carry signals from the sensor 12 to an analyzer (not shown) located at a distance from the sensor 12.

The actuation subassembly 14 includes a first arm 22, a second arm 24, a third arm 26, a fourth arm 28, a first hinge 30, a second hinge 32, and a biasing member 34 (e.g., a helical torsion spring). The first and second arms 22 and 24 each have a proximal portion 22A and 24A and a distal portion 22B and 24B, respectively. In the illustrated embodiment, the respective proximal portions 22A and 24A and distal portions 22B and 24B are arranged at an angle relative to each other. The first and second arms 22 and 24 are pivotally connected to one another by the first hinge 30, which is located an apexes in between the respective proximal portions 22A and 24A and distal portions 22B and 24B of the first and second arms 22 and 24. The distal portions 22B and 24B of the first and second arms 22 and 24 each define an at least partially curved grip feature 36. The biasing member 34 is engaged between the first arm 22 and the second arm 24, and biases the distal portions 22A and 24B of the first and second arms 22 and 24 toward each other about the first hinge 30. One end of the third arm 26 is pivotally connected to the fourth arm 28 by the second hinge 32, and an opposite end of the third arm 26 is pivotally connected to the proximal portion 22A of the first arm 22 by a hinge 35A. Similarly, one end of the fourth arm 28 is pivotally connected to the third arm 26 by the second hinge 32, and an opposite end of the fourth arm 28 is pivotally connected to the proximal portion 24A of the second arm 24 by a hinge 35B. In the illustrated embodiment, the second hinge 32 defines a central opening. The first, second, third and fourth arms 22, 24, 26 and 28 are each made of an electrically insulative material, such as a polymer material or wood. In one embodiment, the actuation subassembly 14 is a 22643 Blanket Pin Extension device available from W.H. Salisbury & Co., Skokie, Ill.

The gripping device 16 is configured to allow an operator to grip and actuate the actuation subassembly 14. In the illustrated embodiment, the gripping device 16 includes a tubular barrel 38 and a moveable hook 40. In alternative embodiments, nearly any type of gripping member can be substituted for the moveable hook 40. The barrel 38 is hollow, and the hook 40 can move into the barrel 38 and extend out from the barrel 38 based on operator manipulation. Control features (not shown) can be provided with the gripping device 16 to allow the operator to manually move the hook 40 relative to the barrel 38. In one embodiment the gripping device 16 is of a type known in the art as a "shotgun", such as a FRP Clampstick device available from W.H. Salisbury & Co. or an A.B. Chance Grip-All Clampstick device available from Hubbell Incorporated, Centralia, Mo.

Straps 42, 44 and 46 help secure the CT sensor 12 to the actuation subassembly 14. An additional strap 48 can be provided to secure the signal cable 18 to the actuation subassembly 14. The straps 42, 44, 46 and 48 are made of an electrically insulative material, such as a polymer material. In one embodiment, the straps 42, 44, 46 and 48 are conventional nylon zip ties (also called cable ties). The straps 42 and 44 are spaced from one another and secure the first half 12A of the CT sensor 12 relative to the actuation subassembly 14 at the grip feature 36 of the distal portion 22B of the first arm 22. The strap 46 secures the second half 12B of the CT sensor 12 relative to the actuation subassembly 14 at the grip feature 36 of the distal portion 24B of the second arm 24.

During operation, the gripping device 16 can be used to actuate the actuation subassembly 14, which in turn can open and close the CT sensor 12. The hook 40 of the gripping device 16 can engage the actuation subassembly 14 at or near the second hinge 32 (e.g., through the opening in the second hinge 32). Movement of the hook 40 relative to the barrel 38 can pull portions of the third and fourth arms 26 and 28 of the actuation subassembly 14 into the barrel 38 of the gripping device 38 (see FIG. 2). Contact between the third and fourth arms 26 and 28 and the barrel 38 pivots the third and fourth arms 26 and 28 toward each other about the second hinge 32. As the third and fourth arms 26 and 28 are pivoted toward each other, the proximal portions 22A and 24A of the first and second arms 22 and 24, respectively, pivotally move toward each other about the first hinge 30 against a biasing force of the biasing member 34. The distal portions 22B and 24b of the first and second arms 22 and 24 pivotally move away from each other about the first hinge 30 as the proximal portions 22A and 24A of the first and second arms 22 and 24, respectively, pivotally moved toward each other.

As the distal portions 22B and 24b of the first and second arms 22 and 24 pivotally move away from each other about the first hinge 30, the first and second halves 12A and 12B of the CT sensor 12 pivotally move apart from each other about the hinge 20. Because pivot axes defined by the hinge 20 of the CT sensor 12 and the first hinge 30 of the actuation subassembly 14 are spaced apart, pivotal movement of the CT sensor 12 is not identical to that of the distal portions 22B and 24B of the first and second arms 22 and 24 of the actuation subassembly 14. The straps 42 and 44 hold the first half 12A of the CT sensor 12 relatively relative to the first arm 22, while the strap 46 permits some sliding movement of the second half 12B of the CT sensor 12B relative to the second arm 24. This configuration allows the CT sensor 12 to open and close along with the actuation subassembly 14 while accommodating the spacing between the hinge 20 of the CT sensor 12 and the first hinge 30 of the actuation subassembly 14. Furthermore, this configuration allows the halves 12A and 12B of the CT sensor 12 to close completely and reliably and be held closed by the biasing member 34, all of which are important for obtaining accurate and reliable performance from the CT sensor 12.

Figure 3:
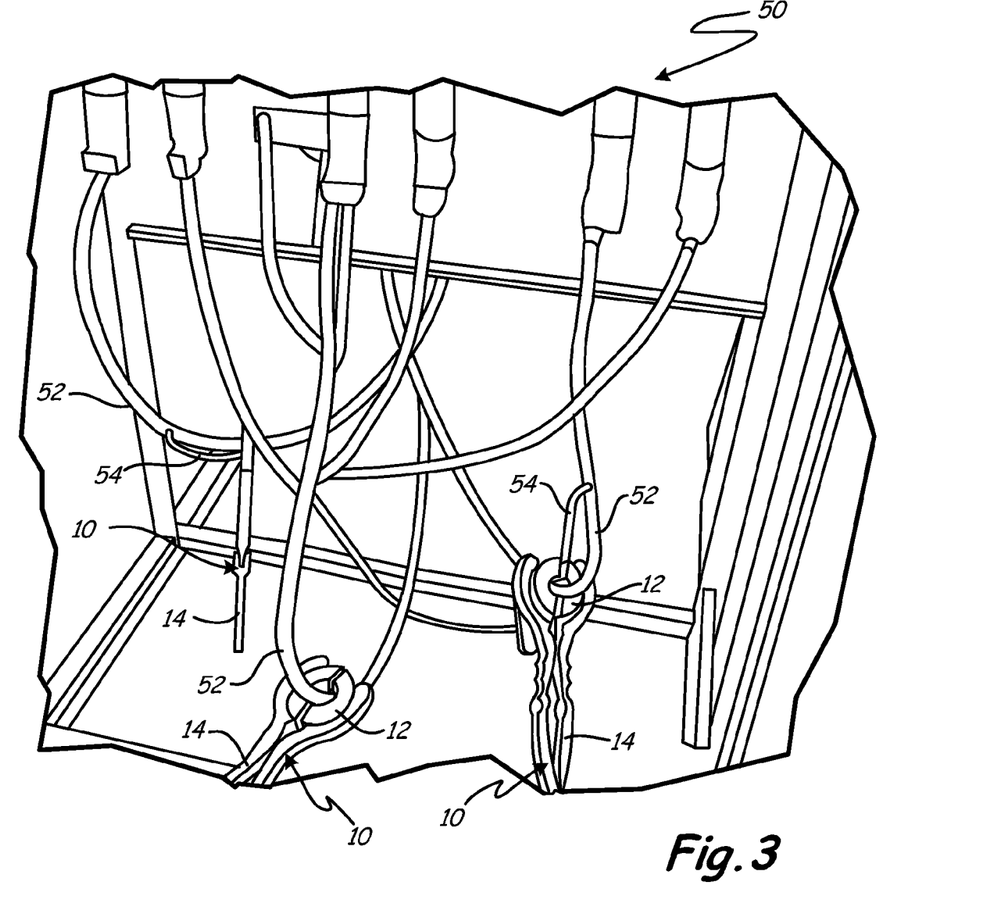
FIG. 3 is a perspective view of three of the assemblies of FIGS. 1 and 2 installed relative to an electrical system.

FIG. 3 is a perspective view of three of the assemblies 10 at respective installation locations inside an enclosure of an electrical system 50. Each of the assemblies 10 has the CT sensor 12 clamped (in a closed position) about a power cable 52 and a grounding wire 54. In the illustrated embodiment, each actuation subassembly 14 is connected to its respective CT sensor 12 at the installation location, but the gripping device 16 (see FIGS. 1 and 2) is removed and disconnected from each actuation assembly 14 during testing. Disengagement of the gripping device 16 from the actuation subassembly is accomplished in a conventional manner, by unhooking, unclamping, or otherwise disengaging the hook 40 from the second hinge 32. It is possible for an operator to carry just one gripping device 16 that can be used to position and install multiple actuation subassemblies 14 and CT sensors 12 sequentially.

Figure 4:
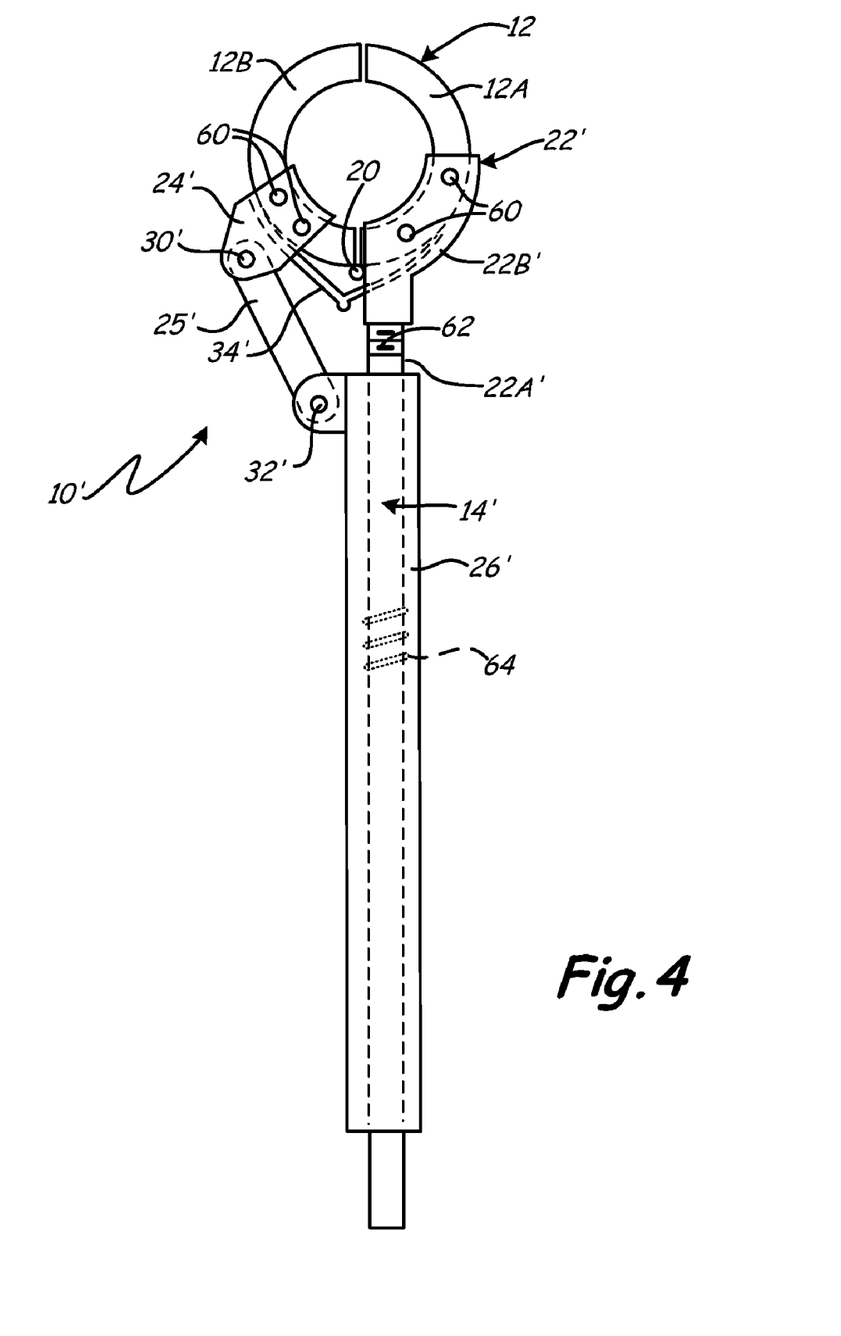
FIG. 4 is a plan view of an alternative embodiment of the online partial discharge testing assembly.

FIG. 4 is a plan view of an alternative embodiment of an online partial discharge testing assembly 10' that includes a split-core RF CT sensor 12 and an actuation subassembly 14'. The CT sensor 12 can be similar to that described above. The actuation subassembly 14' includes a first arm 22', a second arm 24', a linking member 25', a third arm 26', a first pivot 30', a second pivot 32' and a biasing member 34' (e.g., a leaf spring). In the illustrated embodiment, the first and second arms 22' and 24' are each secured to the respective first and second halves 12A and 12B of the CT sensor 12 with fasteners 60 (e.g., set screws). The second arm 24' is pivotally connected to one end of the linking member 25' by the first pivot 30' and an opposite end of the linking member 25' is pivotally connected to the third arm 26' by the second pivot 32'. In the illustrated embodiment, the first arm 22' is elongate in shape and has a first portion 22A' and a second portion 22B'. The first portion 22A' is removably connected to the first portion 22A', such as with an optional threaded connection 62, to facilitate removal of the CT sensor 12 and storage. The third arm 26' is tubular in shape, and at least a portion of the first arm 22' extends into or through the third arm 26'. The third arm 26' is slidably moveable relative to the first arm 22'. An additional biasing member 64 (e.g., a helical spring) is engaged between the first arm 22' and the third arm 26' to bias the actuation subassembly 14' to a closed position (shown in FIG. 4) by default. The biasing member 34' further helps bias the second arm 24' relative to the first arm 22' to close the CT sensor 12. In the embodiment shown in FIG. 4, a gripping device is not required. Yet an operator is still able to open and close the CT sensor 12 from a distance due to the lengths of the first and third arms 22' and 26'.

Figures 5A, 5B:
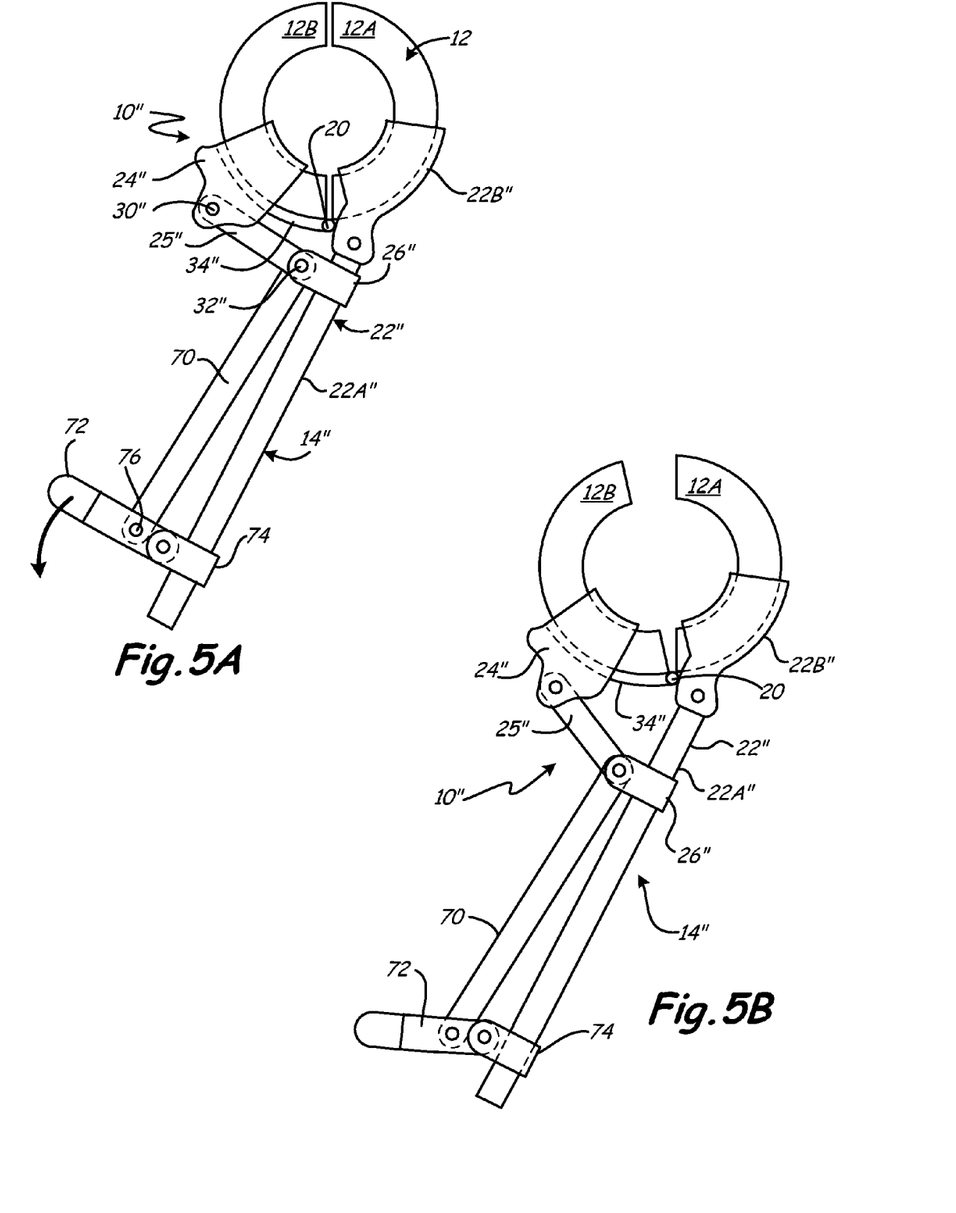
FIG. 5A is a plan view of yet another alternative embodiment of the online partial discharge testing assembly, shown in a closed position.
FIG. 5B is a plan view of the embodiment of the assembly of FIG. 5A, shown in an open position.

FIG. 5A is a plan view of another alternative embodiment of an online partial discharge testing assembly 10", shown in a closed position, and FIG. 5B is a plan view of the assembly 10" shown in an open position. The assembly 10" includes a split-core RF CT sensor 12 and an actuation subassembly 14". The CT sensor 12 can be similar to that described above. The actuation subassembly 14" includes a first arm 22", a second arm 24", a linking member 25", a third arm 26", a first pivot 30", a second pivot 32", a biasing member 34" (e.g., a leaf spring), an additional link 70, a handle 72, and a collar 74. In the illustrated embodiment, the first and second arms 22" and 24" are each secured to the respective first and second halves 12A and 12B of the CT sensor 12. The second arm 24" is pivotally connected to one end of the linking member 25" by the first pivot 30" and an opposite end of the linking member 25" is pivotally connected to the third arm 26" by the second pivot 32". In the illustrated embodiment, the first arm 22" is elongate in shape and has a first portion 22A" and a second portion 22B". The first portion 22A" is pivotally connected to the first portion 22A". The third arm 26" is tubular in shape, and at least a portion of the first arm 22" extends into or through the third arm 26". The third arm 26" is slidably moveable relative to the first arm 22". The biasing member 34" helps bias the second arm 24" relative to the first arm 22" to close the CT sensor 12. On end of the additional link 70 is pivotally connected to the third arm 26" at or near the second pivot 32", and an opposite end of the additional link 70 is pivotally connected to the handle 72. The additional link 70 is arranged alongside and parallel or nearly parallel to the first portion 22A" of the first arm 22". The handle is pivotally connected to the collar 74, which is fixed to the first portion 22A" of the first arm 22". Pivoting movement of the handle 72 by an operator causes movement of the additional link 70, which in turn slides the third arm 26" relative to the first arm 22" and causes pivoting of the second arm 24" and the linking member 25" to open or close the CT sensor 12. In the embodiment shown in FIGS. 5A and 5B, a gripping device is not required. Yet an operator is still able to open and close the CT sensor 12 from a distance due to the length of the first arm 22" and the position of the handle 72.

Figure 6:
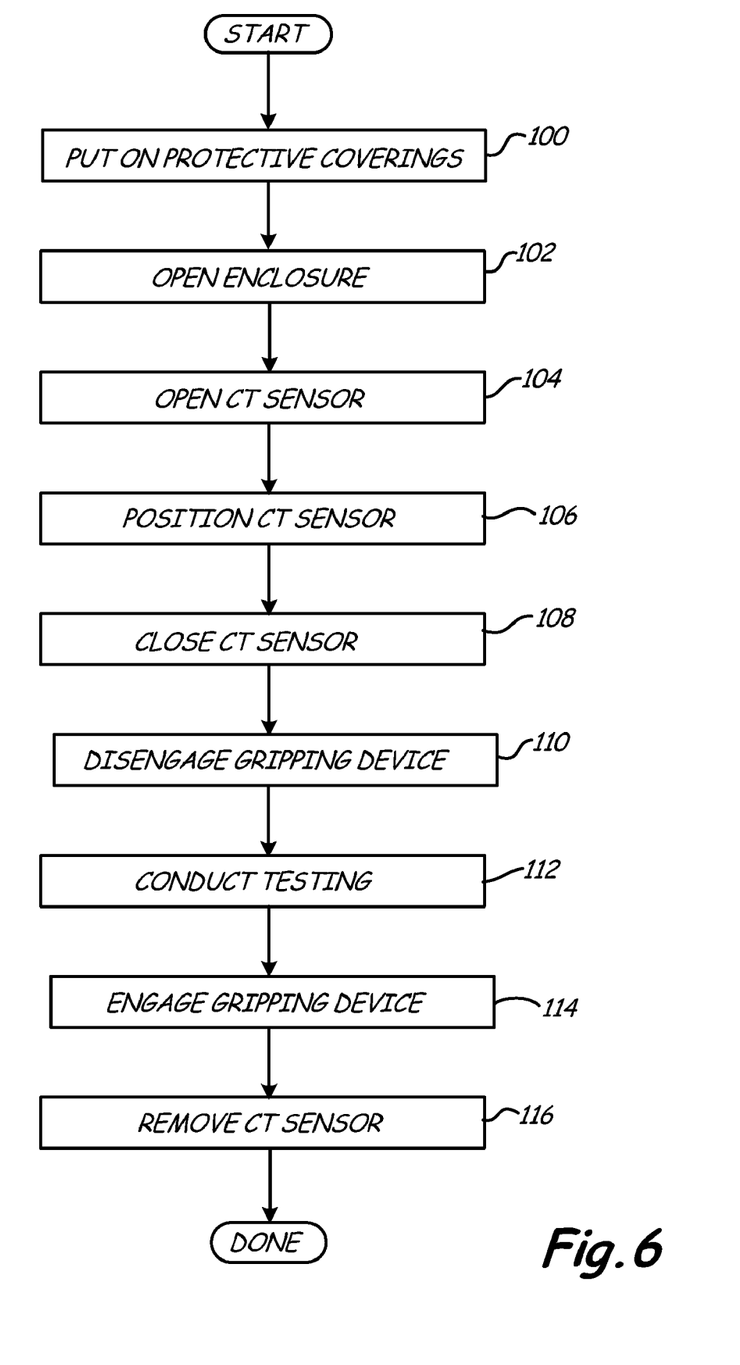
FIG. 6 is a flow chart illustrating a method for performing online partial discharge testing according to the present invention.

FIG. 6 is a flow chart illustrating a method for performing online partial discharge testing. First, an operator puts on protective coverings (step 100). The protective coverings typically include gloves, but can further include a frock, boots, headgear, etc. These protective coverings promote operator safety, though they generally reduce the operator's manual dexterity and freedom of movement to some degree. Next, an enclosure, if any, is opened to access a desired installation location of an electrical system (step 102). A split-core CT sensor is then opened by the operator (step 104) and the CT sensor is positioned at the desired installation location while the operator, wearing his or her protective coverings, is at a distance from the CT sensor and the installation location (step 106). The operator then closes the CT sensor while remaining at a distance from the CT sensor and the installation location (step 108). If a gripping device is being used to help open and close the CT sensor, the gripping device is disengaged from the actuation subassembly and removed (step 110). The operator can then conduct an online partial discharge testing protocol (step 112), using an analyzer or other equipment to receive and/or process data from the CT sensor. After testing is complete, the gripping device, if used, is engaged again to the actuation subassembly (step 114). Then the CT sensor is opened and removed from the installation location (step 116). The enclosure, if any, can be closed and the procedure finished.

In view of the preceding discussion, it will be recognized that the present invention provides numerous advantages and benefits. For example, the present invention allows operators to relatively easily manipulate and position a split-core CT sensor relative to an installation location while remaining at a distance from electrically energized objects. Furthermore, the present invention provides the ability to open and close a split-core CT sensor in such a way that the CT sensor opens wide enough to permit placement about a power cable, while also facilitating relatively secure and reliable closing to promote good testing performance and CT sensor sensitivity. In addition, an assembly according to the present invention is manually operable by an operator wearing protective coverings.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims. For example, partial discharge testing assemblies according to the present invention can be utilized in conjunction with a variety of types of signal analysis systems and methods.

The invention claimed is:

1. An apparatus for online partial discharge testing, the apparatus comprising:
   a split-core radio-frequency current transformer sensor having a first portion, a second portion, and a sensor hinge operably engaged between the first portion and the second portion;
   an actuation subassembly comprising:
      an elongate first member secured to the first portion of the split-core radio-frequency current transformer sensor;
      a second member secured to the second portion of the split-core radio-frequency current transformer sensor and configured to be movable relative to the first member; and
      a third member engaged with the second member and configured to be movable relative to the first member;
   a biasing member configured to pivotally bias the first portion and the second portion of the split-core radio-frequency current transformer sensor toward each other relative to the sensor hinge, wherein the biasing member is secured relative to the first member; and
   a first strap for securing the first portion of the split-core radio-frequency current transformer sensor to the first member of the actuation subassembly;
   a second strap for securing the first portion of the split-core radio-frequency current transformer sensor to the first member of the actuation subassembly; and
   a third strap for securing the second portion of the split-core radio-frequency current transformer sensor to the second member of the actuation subassembly.

2. The apparatus of claim 1, wherein the biasing member comprises a helical spring.

3. The apparatus of claim 1, wherein the biasing member comprises a leaf spring operatively engaged between the first member and the second member.

4. A method comprising:
   opening a split-core radio-frequency current transformer sensor, wherein the opening step comprises:
      pivoting distal portions of a first arm and a second arm away from each other about an actuation hinge;
      pivoting a third arm and a fourth arm toward each other about a proximal hinge; and pivoting a first half and a second half of the split-core radio-frequency current transformer sensor away from each other about a sensor hinge that is spaced from the actuation hinge;

positioning the open split-core radio-frequency current transformer sensor about an energized electrical cable; and closing the split-core radio-frequency current transformer sensor, wherein the closing step comprises:
pivoting distal portions of the first arm and the second arm toward each other about the actuation hinge;
pivoting a third arm and a fourth arm away from each other about the proximal hinge; and
pivoting the first half and the second half of the split-core radio-frequency current transformer sensor toward each other about the sensor hinge.

5. The method of claim 4 and further comprising:
providing protective coverings for an operator prior to the step of opening the split-core radio-frequency current transformer sensor.

6. The method of claim 4 and further comprising:
engaging at least one of the third arm and the fourth arm with a gripping device.

7. The method of claim 4, wherein the step of pivoting the third arm and the fourth arm toward each other about the proximal hinge comprises retracting the proximal hinge and at least portions of the third arm and the fourth arm into a hollow member, wherein the hollow member contacts the third arm and the fourth arm.

8. The method of claim 4, wherein the step of pivoting the third arm and the fourth arm toward each other about the proximal hinge comprises manually urging the third arm and the fourth arm against a biasing force of a spring member.

9. An assembly for online partial discharge testing, the assembly comprising:
a split-core radio-frequency current transformer sensor having a first half and a second half connected by a sensor hinge;
an actuation subassembly comprising:
a first arm comprising electrically insulative material and having a distal portion and an opposite proximal portion, wherein the distal portion of the first arm defines an at least partially curved grip feature, and wherein the distal portion and the proximal portion of the first arm are angled relative to each other and meet and a first apex;
a second arm comprising electrically insulative material and having a distal portion and an opposite proximal portion, wherein the distal portion of the second arm defines an at least partially curved grip feature, and wherein the distal portion and the proximal portion of the second arm are angled relative to each other and meet and a second apex;
an actuation hinge connecting the first apex of the first arm and the second apex of the second arm, wherein the actuation hinge is spaced from the sensor hinge;
a biasing member for biasing distal portions of the first and second arms toward each other relative to the actuation hinge;
a third arm comprising electrically insulative material and pivotally connected to the proximal portion of the first arm; and
a fourth arm comprising electrically insulative material and pivotally connected to the proximal portion of the second arm, wherein the third arm and fourth arm are pivotally connected to each other at a proximal hinge located opposite the pivotal connections to the first and second arms; and
one or more fasteners for securing the split-core radio-frequency current transformer sensor to at least one of the first arm and the second arm of the actuation subassembly,
wherein the assembly is configured such that the distal portions of the first arm and the second arm of the actuation subassembly can pivot about the actuation hinge to cause the first half and the second half of the split-core radio-frequency current transformer sensor to pivot about the sensor hinge.

10. The assembly of claim 9 and further comprising:
a signal cable connector operatively connected to the split-core radio-frequency current transformer sensor.

11. The assembly of claim 10 and further comprising:
a signal cable operable connected to the signal cable connector.

12. The assembly of claim 9 and further comprising:
a selectively engageable gripping device for actuating the actuation subassembly, the gripping device comprising:
a hollow member;
a moveable gripping member extending at least partially into the hollow member, the gripping member configured to selectively grip the actuation subassembly at or near the proximal hinge, wherein the gripping member is configured to selectively move at least portions of the third arm and the fourth arm of the actuation subassembly into the hollow member.

13. The assembly of claim 12, wherein the gripping device is configured such that when the at least portions of the third arm and the fourth arm of the actuation subassembly extend into the hollow member, the third arm and the fourth arm are pivotally positioned closer to each other, and wherein when the third arm and the fourth arm are pivotally positioned closer to each other the proximal portions of the first arm and the second arm are pivotally positioned close to each other such that the grip features of the distal portions of the first arm and the second arm are pivotally positioned away from each other relative to the actuation hinge to pivotally open the first half and the second half of the split-core radio-frequency current transformer sensor relative to the sensor hinge.

14. The assembly of claim 12, wherein the gripping member is manually operable.

15. The assembly of claim 9, wherein the biasing member urges the first half and the second half of the split-core radio-frequency current transformer sensor together.

16. The assembly of claim 9 and further comprising:
an energized electrical cable, wherein the split-core radio-frequency current transformer sensor is positioned about the energized electrical cable to generate sensor data.

17. The assembly of claim 9, wherein the one or more fasteners comprise:
a first strap for securing the first half of the split-core radio-frequency current transformer sensor to the grip feature of the first arm of the actuation subassembly;
a second strap for securing the first half of the split-core radio-frequency current transformer sensor to the grip feature of the first arm of the actuation subassembly; and
a third strap for securing the second half of the split-core radio-frequency current transformer sensor to the grip feature of the second arm of the actuation subassembly.

* * * * *